United States Patent [19]

Fujita et al.

[11] Patent Number: 4,719,371
[45] Date of Patent: Jan. 12, 1988

[54] DIFFERENTIAL TYPE GATE CIRCUIT HAVING CONTROL SIGNAL INPUT

[75] Inventors: Bunichi Fujita; Seiichi Kawashima, both of Hatano, Japan

[73] Assignee: Hitachi, Ltd., Tokyo, Japan

[21] Appl. No.: 687,765

[22] Filed: Dec. 31, 1984

[30] Foreign Application Priority Data

Dec. 30, 1983 [JP] Japan .................. 58-247652

[51] Int. Cl.$^4$ ......................................... H03K 19/086
[52] U.S. Cl. ............................... 307/455; 307/443; 307/467; 307/265
[58] Field of Search ............... 307/443, 455, 467, 470, 307/471, 241, 243, 254, 265, 592, 595, 601, 603, 605

[56] References Cited

U.S. PATENT DOCUMENTS

| | | | |
|---|---|---|---|
| 3,786,357 | 1/1974 | Isle | 307/595 X |
| 4,069,429 | 1/1978 | White et al. | 307/265 |
| 4,071,781 | 1/1978 | Kayalioglu | 307/265 |
| 4,171,526 | 10/1979 | Bauer | 307/265 |
| 4,546,272 | 10/1985 | Suzuki et al. | 307/455 |
| 4,551,639 | 11/1985 | Takeda et al. | 307/455 |
| 4,572,967 | 2/1986 | Metz | 307/243 |
| 4,580,066 | 4/1986 | Berndt | 307/455 X |
| 4,641,048 | 2/1987 | Pollock | 307/595 X |

FOREIGN PATENT DOCUMENTS 2125646 3/1984 United Kingdom ............... 307/455

Primary Examiner—Stanley D. Miller
Assistant Examiner—D. R. Hudspeth
Attorney, Agent, or Firm—Antonelli, Terry & Wands

[57] ABSTRACT

An ordinary differential type gate circuit has two transistors to which complementary inputs are given and which are turned on and off, and complementary type outputs in accordance with the states of the complementary inputs are generated from the collectors of those transistors. In this invention, there are further added a fixed threshold type gate circuit to which is inputted a control signal and a circuit which, when the control signal is inputted to this fixed threshold type gate circuit, generates complementary outputs in constant states irrespective of the states of the complementary inputs in response to the state of the control signal, thereby preventing the inputs applied to the differential type gate circuit from being reflected to the outputs.

9 Claims, 6 Drawing Figures $Y = (A \cdot \overline{C}) + (B \cdot \overline{D})$ $Y = (A \cdot \overline{C}) + (B \cdot \overline{D})$ $Y = (A \cdot \overline{C}) + (\overline{B} \cdot \overline{D})$

DIFFERENTIAL TYPE GATE CIRCUIT HAVING CONTROL SIGNAL INPUT

BACKGROUND OF THE INVENTION

1. Field of the Invention

The present invention relates to a differential type gate logic circuit and, more particularly, to a differential type gate circuit which is suitable to select and output an input signal of a differential type gate logic circuit.

2. Description of the Prior Art

In a logic gate circuit having a fixed threshold value, when an input voltage exceeds this threshold value, turn-off and turn-on of transistors as component elements of the gate circuit start and the output voltage changes.

In such a logic gate circuit, when a noise is added at the rise time of the input voltage, the input voltage will have exceeded the threshold value early, so that the output voltage also changes early. Such fluctuation in the output voltage occurs in the logic gate circuit of the fixed threshold type.

A differential type gate circuit is used to solve such a problem. In the differential type logic gates, each input signal and its inverted signal is given as one set (This is called complementary input signals.). With respect to each input signal, the output voltage starts changing when the voltage of the input signal equals to the voltage of its inverted signal.

Even when a noise occurs at the rise of the input signal, both the input signal and its inverted signal are influenced. Thus, the time point when the voltage of the input signal equals the voltage of the inverted signal does not change. Therefore, the early change the output voltage due to noise is prevented.

However, unlike the gate circuit having a fixed threshold value, the differential type gate circuit has a limitation such that the input signal must always be of the complementary type. Therefore, it is impossible to further apply a control signal as an input signal to the gate circuit. Consequently, in the case where the control signal is needed, it is necessary to constitute the differential type gate circuits in multiple stages. This means that an extremely large amount of hardware is required as compared with the fixed threshold gate circuit.

SUMMARY OF THE INVENTION

It is an object of the present invention to solve the above-mentioned problem and to provide a differential type gate circuit which can input a control signal without increasing the number of stages of the gate circuits.

According to one aspect of the invention, in a differential type gate circuit which has two transistors in which complementary inputs are given to the respective gates and which generates complementary outputs in accordance with those inputs, there is added to such a differential type gate circuit a circuit for cutting off those two transistors by utilizing the input of the control signal and setting the positive output between the complementary outputs to a low level.

DESCRIPTION OF THE PREFERRED EMBODIMENTS

Figure 1:
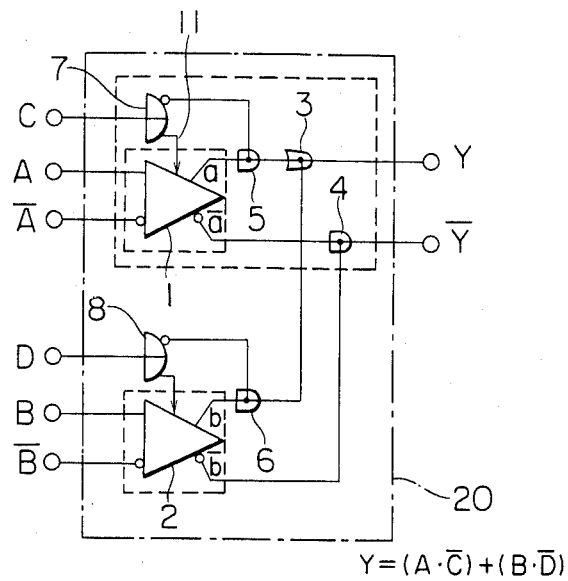
FIG. 1 is a differential type OR circuit having a differential type gate circuit according to the present invention.

FIG. 1 shows a differential type OR circuit using a differential type gate circuit according to the present invention. This OR circuit generates an OR output signal Y of an input signal A and an input signal B. Since this circuit is of the differential type, each signal is accompanied with the inverted signal of that signal. The level of the input signal A is reflected in a positive side output a of a differential type gate 1, while the inverted signal of the input signal A appears at a negative side output ā. A differential type gate 2 is also similar to the differential type gate 1. The OR of the respective positive side outputs of the differential type gates 1 and 2 is obtained by a wired OR 3, so that the OR output Y of the input signals A and B is generated. The AND of the respective negative side outputs is derived by a wired AND 4, so that the inverted output of the OR output Y is generated. In this invention, the abovementioned conventional differential type OR gate is provided with control circuits 7 and 8 for suppressing the positive side and negative side outputs of the differential type gates. Both C and D are control signals, and either the output of the differential type gate citcuit 1 or 2 is suppressed or the output according to the state of the input signal is generated in dependence upon that the control signals are at a high level or low level.

Figure 2:
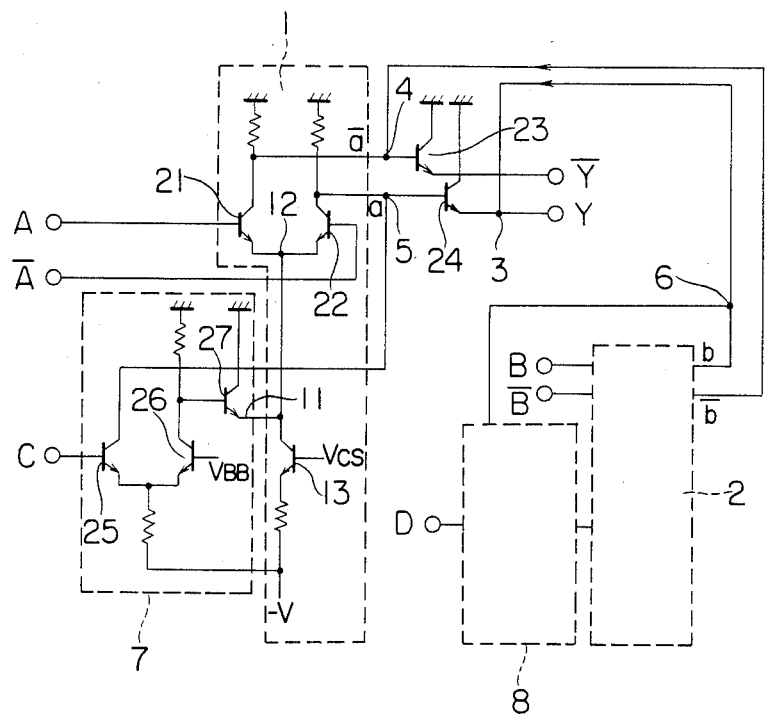
FIG. 2 is a detailed diagram of the circuit of FIG. 1.

FIG. 2 shows the details of the circuit of FIG. 1. In FIG. 2, reference numeral 8 denotes the circuit with the same constitution as the circuit 7 and numeral 2 indicates the circuit with the same constitution as the circuit 1.

The operation in the case where the control circuit 7 is not provided will be first explained. When the input signal A is at a high level, a transistor 21 is turned on and a current flows through a transistor 13 serving as a current source to a resistor on the collector side of the transistor 21, so that its collector output ā becomes a low level and the output Y whose level was adjusted by a transistor 23 also becomes a low level. On the other hand, since a transistor 22 is cut off, the output a becomes a high level, so that a high level output Y whose level was shifted by the voltage drop between the base and emitter of a transistor 24 is generated. When the input signal A is at a low level, the output opposite to the above is generated. The above is the operation of an ordinary differential type gate circuit.

The control circuit 7 has transistors 25 and 26 constituting a fixed threshold type gate circuit. A fixed threshold voltage $V_{BB}$ is applied to the base of the transistor 26. The collector of the transistor 25 is connected to the wired AND 6. When an input signal C to the base of the transistor 25 is at a low level, the transistor 25 is cut off and the transistor 26 is turned on. A transistor 27 whose base is connected to the collector of the transistor 26 and whose emitter is connected to the collector of the transistor 13 is further provided. When the input signal C which is applied to the transistor 25 is at a low level, the transistor 27 is in the cut-off state since the base thereof is at a low level. Since both transistors 25 and 27 are cut off in this way when the input signal is at a low level, the operation of the differential gate is not influenced. When the input signal C becomes a high level, the transistor 25 is turned on and the collector voltage becomes a low level. On the other hand, the transistor 26 is cut off, so that the base of the transistor 27 is turned on and the current flowing through one of the transistors 21 and 22 and through the transistor 13 changes to the current which flows through the transistors 27 and 13. Consequently, no current flows through the transistors 21 and 22 and the collector voltage of the transistor 21 becomes a high level. Since the collector of the transistor 22 is connected to the collector of the transistor 25, the collector voltage of the transistor 22 becomes a low level. As described above, when the input signal is at a high level, the output Y becomes a low level and the output $\overline{Y}$ becomes a high level, that is, the output becomes the state of "0" irrespective of the state of the input A. Thus, it is prevented by the control signal C that the input A to the differential gate circuit is outputted. The above is the description of the arrangement and operation of the differential type gate circuit having a control signal input according to the invention.

Next, there will be described a differential type OR circuit having two input signals in which a control signal is provided with respect to each input signal. In the other differential type gate circuit 2 shown in FIG. 2, the input signal B is controlled by the control signal D. A positive output b is wired-ORed to the Y output and an inverting output $\overline{b}$ is wired-ANDed to the output $\overline{a}$ by the wired AND circuit 4. When both control signals C and D are at a low level, the outputs Y and $\overline{Y}$ become the OR outputs of A, $\overline{A}$ and B, $\overline{B}$. For example, assuming that the control signal C is at a high level and the control signal D is at a low level, the input signal A will be cut off and only the input signal B will be reflected in the output Y. In this way, the selection of the input signals can be realized.

Figure 3:
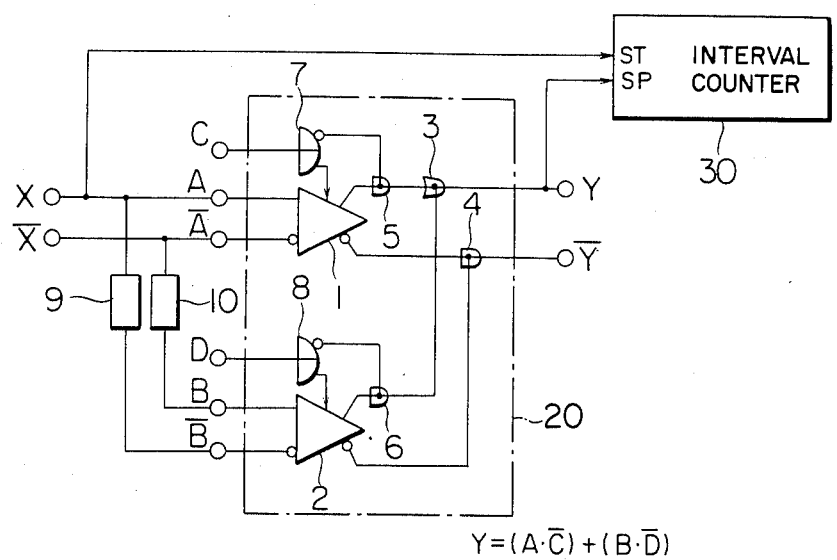
FIG. 3 is an applied form of the circuit of FIG. 1.
Figure 4:
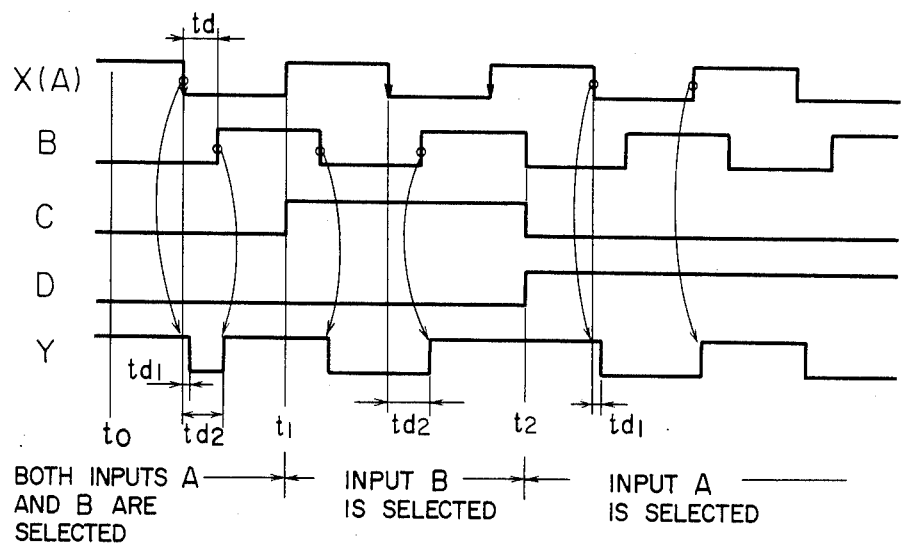
FIG. 4 is a time chart showing the operation of the circuit of FIG. 3.

FIG. 3 shows an applied form of the invention and FIG. 4 shows a time chart for explaining the operation thereof.

FIG. 3 shows a pulse width setting circuit which is constituted by modifying the input signal to the differential type OR circuit 20 shown in FIG. 1. Input signals X and $\overline{X}$ are directly inputted as A and $\overline{A}$, and at the same time they are applied to B and $\overline{B}$ through delay elements 9 and 10 each having the same delay amount.

Next, the operation will be explained with reference to a timing chart of FIG. 4. Assuming that the wide input pulse is X, the input signal A having the same pulse waveform as that of the input pulse X is inputted to a non-inverting input pin A of the first differential gate 1 (the complementary signal $\overline{X}$ of the X waveform is inputted to an inverting input pin $\overline{A}$ of the first differential gate 1). The signal B which is the inverted signal of the input pulse X and has been delayed by a delay time $t_d$ of the delay element 10 is inputted to a non-inverting input pin B of the second differential gate 2.

The circuit operates as the pulse width setting circuit in the interval between times $t_0$ and $t_1$ and both inputs C and D of the first and second control circuits 7 and 8 are at an "L" level. In this case, the waveform of the output Y is such that the falling edge side is determined by the falling edge side of the signal A having the same waveform as the input pulse X and the rising edge side is determined by the time point which has been delayed by $t_d(T_w=t_d=t_{d2}-t_{d1})$ from the falling edge side of the signal A. Therefore, the pulse width equals the difference in path delay from the X input to the Y output, namely, $$T_w = t_{d2} - t_{d1}$$

As described above, even when there is a variation in input pulse width, the pulse of a constant pulse width is obtained.

On the other hand, in the case where the output pulse width is a few nano-seconds which is extremely narrow, it cannot be directly measured by other measuring apparatuses than an oscilloscope. Although there is available an interval counter which performs a counting operation during the interval from the input of a signal until the input of a next signal and thereby to measure this interval, a narrow pulse is ordinarily insufficient to control the start and stop of the counting operation of the interval counter. Thus, the interval counter has been considered to be unsuitable for measurement of the pulse width of the narrow pulse.

In view of the above, the Y output of the differential type OR circuit 20 is inputted to a stop terminal SP of an interval counter (time interval counter 5370B made by HP Co., Ltd.) 30 and the X input is inputted to a start terminal ST.

The input C of the control circuit 7 is first set to an "H" level and the signal B is selected, thereby measuring the time $t_{d2}$. The operation at this time corresponds to the interval from $t_1$ to $t_2$ in FIG. 4.

Since the input C to the first control circuit 7 is at an "H" level in the interval between times $t_1$ and $t_2$, the output of the first differential gate 1 is cut off, so that the input signal B to the second differential gate 2 can be fetched as it is at the Y output.

At this time, the falling edge of the input X becomes the start signal to the interval counter 30, while the rising edge of the output Y becomes the stop signal. Since each signal has an enough pulse duration, the time $t_{d2}$ is measured.

Next, the input D to the ordinary gate 8 is set to an "H" level and the A input (X input) is selected, thereby obtaining the time $t_{d1}$. The operation at this time corresponds to the interval after $t_2$ in FIG. 4.

After time $t_2$, the input D to the second control circuit 8 becomes an "H" level and the input C to the first control circuit 7 becomes an "L" level, so that the output of the second differential gate 2 is cut off and the signal A which the same one as the input pulse S to the first differential gate 1 is fetched at the Y output.

In this case also, the falling edge of the X becomes the start signal to the interval counter 30 and the rising edge of the Y becomes the stop signal. Since each signal has a sufficient pulse duration, the time $t_{d1}$ is derived.

The pulse width $T_w$ can be obtained by performing the calculation of $T_w = t_{d2} - t_{d1}$.

Figure 5:
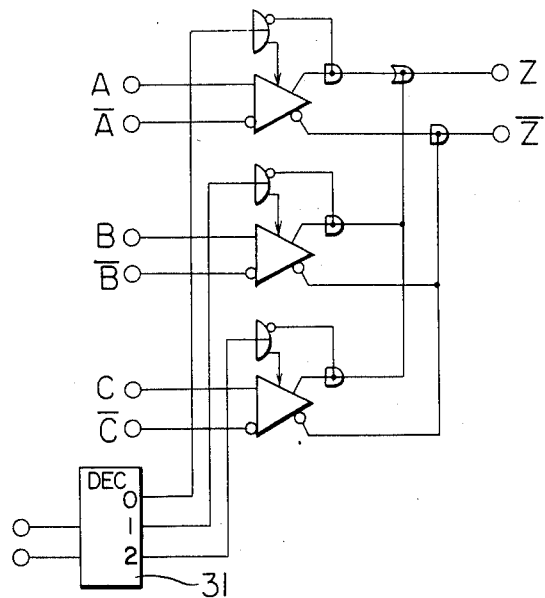
FIG. 5 is another applied form of the circuit of FIG. 1.

FIG. 5 shows an example wherein the differential type gate circuit according to the invention was applied to a selecting circuit. This circuit is constituted by adding one input to the OR circuit in FIG. 1 and outputs of a decorder 31 are given as control signals to respective differential type gate circuits. Therefore, one of the input signals A, B and C is selected in dependence upon the outputs of the decoder 31.

Figure 6:
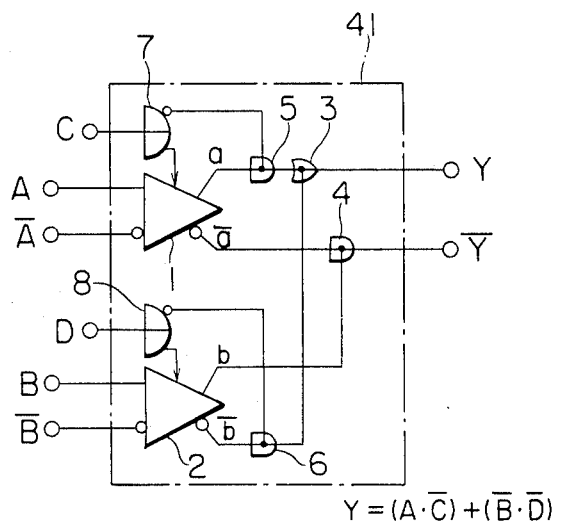
FIG. 6 is a modified form of the circuit of FIG. 1.

FIG. 6 shows a modified form of the differential type OR gate circuit of FIG. 1. The operation of this circuit is substantially similar to that of the circuit of FIG. 1 except that $\bar{b}$ is wired-ORed to a and b is wired-ANDed to $\bar{a}$.

As described above, according to the invention, a differential gate having a pair of complementary inputs has a function such that a signal to be derived as an output can be selected from the outside, and accordingly, the transmission through the main path can be all performed by using the differential gate arrangement. And therefore, it is possible to fully expect the inherent performance of the differential gate such as reduction of noise or the like and there is no need of any special logic for control. Therefore, excellent effects such as reduction of the number of logic stages and simplification thereof are obtained.

We claim:

1. A differential type gate circuit comprising:
    first and second transistors in which complementary signal inputs are applied to each base;
    a current source connnected to emitters of said first and second transistors;
    output lines coupled to respective collectors of said first and second transistors, one of said output lines outputting a positive output signal and the other outputting its inverted output signal; and
    a control circuit which receives a control signal and cuts off currents flowing to said current source through said first and second transistors in response to said control signal and which sets a voltage at said output line for outputting the positive output signal to a low level,
    wherein said control circuit includes a third transistor in which said control signal is applied to its base, a fourth transistor in which a certain constant voltage is applied to its base, and a fifth transistor which is connected between a certain voltage level and a connection point of said current source and the emitters of said first and second transistors, which fifth transistor is switched by a collector voltage of the fourth transistor, wherein the emitters of said third and fourth transistors are coupled to one another, and wherein either one of said third and fourth transistors is made conductive in dependence upon the presence and absence of said control signal and the collector of said third transistor is connected to the output line for outputting said positive output signal.

2. A differential type gate circuit comprising:
    a first transistor in which a positive input signal is applied to its base and a first output is outputted from its collector;
    a second transistor in which an inverted input signal is applied to its base and a second output is outputted from its collector;
    a current source connected to emitters of said first and second transistors;
    a fixed switching threshold type gate circuit which receives a control signal as an input signal thereto; and
    control means for setting said first output to a high level and setting said second output to a low level when said control signal is inputted to said fixed switching threshold type gate circuit,
    wherein said fixed switching threshold type gate circuit includes a third transistor in which said control signal is applied to its base and fourth transistor in which a constant voltage is applied to its base, wherein the emitters of said third and fourth transistors are coupled to one another, and wherein said control means includes means for connecting a collector of said third transistor to said second output and shunt means connected to said current source and said fourth transistor for shunting currents flowing to said current source through said first and second transistors in dependence upon a collector voltage of said fourth transistor.

3. A differential type gate circuit according to claim 2, wherein said shunt means allows a current flowing therethrough which makes the currents flowing through the first and second transistors reduce enough to set collector voltage levels of said first and second transistors to a high level.

4. A differential type OR gate circuit which is inputted with two input signals and their complements and which outputs an OR output signal and its complement, comprising:
    a pair of differential type element gate circuits each applied with a respective one of said input signals and its respective complement and each having:
        a first transistor in which said input signal is applied to its base and a first output is outputted from its collector,
        a second transistor in which the complement of said input signal is applied to its base and a second output is outputted from its collector,
        a current source connected to emitters of said first and second transistors, and
        control means including a fixed switching threshold type gate circuit coupled to said current source and to said first and second transistors, for setting a predetermined voltage to a connection point of said current source and said emitters of said first and second transistors, and for setting said first output to a level which is lower than said predetermined voltage when said control signal is inputted to said fixed switching threshold type gate circuit,
    a first emitter follower transistor having a base connected to said first outputs of said pair of differential type element gate circuits, and
    a second emitter follower transistor having a base connected to one of said second outputs of said pair of differential type element gate circuits, and having an emitter connected to the other second outputs of said pair of differential type element gate circuits,
    wherein emitters of said first and second emitter follower transistors output said OR output signal and its complement.

5. A differential type OR gate circuit comprising:
    first and second transistors in which complementary inputs are applied to each base;
    a current source connected to emitters of said first and second transistors;
    first and second output lines coupled to respective collectors of said first and second transistors, said first output line outputting a positive output signal and the second output line outputting an inverted output signal;
    a pair of resistor means respectively connecting said collectors of said first and second transistors to a predetermined voltage;
    setting means connected to said predetermined voltage for setting said predetermined voltage to a connection point of said current source and said emitters of said first and second transistors in response to a control signal; and control means coupled between an input node for said control signal and said setting means for setting a voltage at said first output line to a voltage which is lower than said predetermined voltage in response to said control signal.

6. A differential type gate circuit according to claim 5, wherein said control means includes a third transistor in which said control signal is applied to its base and a fourth transistor in which a constant voltage is applied to its base, a collector of said third transistor being connected to said output line, wherein emitters of said third and fourth transistors are coupled to one another.

7. A differential type gate circuit according to claim 6, wherein said setting means includes a fifth transistor having a base connected to a collector of said fourth transistor and an emitter connected to said connection point, said predetermined voltage being applied to a collector of said fifth transistor.

8. A differential type OR gate circuit which is inputted with two input signals and their complements and which outputs an OR output signal and its complement, comprising:

a plurality of differential type element gate circuits each applied with a respective one of said input signals and its respective complement and each having:

first and second transistors in which one of said input signals and its complement are respectively applied to each base, a current source connected to emitters of said first and second transistors, first and second output lines coupled to respective collectors of said first and second transistors, said first output line outputting a positive output signal and the second output line outputting an inverted output signal, a pair of resistor means respectively connected to between said collectors of said first and second transistors and a predetermined voltage, setting means connected to said predetermined voltage for setting said predetermined voltage to a connection point of said current source and said emitters of said first and second transistors in response to a control signal, and control means coupled between a input node for said control signal and said setting means for setting a voltage at said first output line to a voltage which is lower than said predetermined voltage in response to said control signal, wherein the first outputs of said plurality of differential type element gate circuits are wired-AND connected to each other and the second outputs are wired-OR connected to each other.

9. A differential type pulse width setting circuit comprising:

a delay circuit inputted with a complementary input signal for delaying said complementary input signal for a predetermined time to provide a delayed complementary input signal;

first and second differential type element gate circuits each having a first transistor in which as first output is outputted from its collector, a second transistor in which a second output is outputted from its collector, a current source connected to emitters of said first and second transistors, and control means including a fixed switching threshold type gate circuit coupled to said current source and receiving a control signal, for setting a predetermined voltage to a connection point of said current source and said emitters of said first and second transistors and for setting said first output to a level which is lower than said predetermined voltage when said control signal is inputted to said fixed switching threshold type gate circuit, wherein bases of first and second transistors belonging to said first differential type element gate circuit are applied with said complementary input signal, and bases of first and second transistors belonging to said second differential type element gate circuit are applied with said delayed complementary input signal by said delay circuit, wherein the first outputs of said plurality of differential type element gate circuits are wired-AND connected to each other and the second outputs are wired-OR connected to each other.

* * * * *